(12) United States Patent
Akutsu et al.

(10) Patent No.: US 8,319,222 B2
(45) Date of Patent: Nov. 27, 2012

(54) ADHESIVE COMPOSITION

(75) Inventors: Yasushi Akutsu, Tochigi (JP); Yasunobu Yamada, Tochigi (JP); Kouichi Miyauchi, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 13/137,141

(22) Filed: Jul. 22, 2011

(65) Prior Publication Data

US 2011/0281119 A1 Nov. 17, 2011

Related U.S. Application Data

(62) Division of application No. 12/312,000, filed as application No. PCT/JP2008/060525 on Jun. 9, 2008, now Pat. No. 8,221,880.

(30) Foreign Application Priority Data

Jun. 12, 2007 (JP) ................................. 2007-154966

(51) Int. Cl.
*H01L 29/00* (2006.01)

(52) U.S. Cl. .......... 257/59; 257/753; 257/783; 257/786; 252/500; 252/511; 174/259; 428/355 R; 428/356; 428/423.1

(58) Field of Classification Search . 428/355 BL–423.8, 428/355 R, 356, 423.1; 156/325–331; 257/59, 257/753, 783, 786; 252/500, 511; 174/259
See application file for complete search history.

(56) References Cited

U.S. PATENT DOCUMENTS

| 4,278,809 A | 7/1981 | Burdett |
| 4,755,564 A | 7/1988 | Lindner et al. |
| 4,999,136 A | 3/1991 | Su et al. |
| 5,326,903 A | 7/1994 | Shimasaki et al. |
| 5,334,659 A | 8/1994 | Scobbo, Jr. et al. |
| 5,827,923 A | 10/1998 | Medford et al. |
| 2003/0198914 A1* | 10/2003 | Brennan et al. ................ 433/9 |
| 2007/0021533 A1 | 1/2007 | Yan et al. |
| 2007/0029309 A1 | 2/2007 | Keite-Telgenbuscher et al. |
| 2009/0202739 A1 | 8/2009 | O'Neill et al. |
| 2009/0309220 A1* | 12/2009 | Katogi et al. ................ 257/741 |

(Continued)

FOREIGN PATENT DOCUMENTS

CN 101142292 A 3/2008

(Continued)

OTHER PUBLICATIONS

Nov. 9, 2011 Chinese Office Action issued in Chinese Patent Application No. 200880019609.6 (with translation).

(Continued)

*Primary Examiner* — Lorna M Douyon
*Assistant Examiner* — Tri V Nguyen
(74) *Attorney, Agent, or Firm* — Oliff & Berridge, PLC

(57) ABSTRACT

A connection structure comprising an adhesive composition is provided. The adhesive composition is capable of providing good adhesion strength to the polyimide surface of a flexible circuit board that is exposed on the metal wiring surface and between the traces even when the polyimide surface is relatively smooth. The adhesive composition contains a thermoplastic resin, a polyfunctional acrylate, and a radical polymerization initiator and further contains a monofunctional urethane acrylate having a urethane residue at its terminal end. The monofunctional urethane acrylate is represented by the formula (1):

$$CH_2=CR_0-COO-R_1-NHCOO-R_2 \qquad (1)$$

wherein $R_0$ is a hydrogen atom or a methyl group, $R_1$ is a divalent hydrocarbon group, and $R_2$ is an optionally substituted lower alkyl group.

7 Claims, 1 Drawing Sheet

Measurement method: 90 degree peel
Measurement speed: 50 mm/min

U.S. PATENT DOCUMENTS

2010/0065788 A1    3/2010   Momose et al.

FOREIGN PATENT DOCUMENTS

| EP | 1 860 170 A1 | 11/2007 |
|---|---|---|
| JP | A-54-005921 | 1/1979 |
| JP | A-05-032952 | 2/1993 |
| JP | A-2005-281594 | 10/2005 |
| JP | A-2006-257208 | 9/2006 |
| JP | A-2008-081579 | 4/2008 |
| WO | WO2006098352 A1 * | 9/2006 |

OTHER PUBLICATIONS

Jan. 17, 2012 Taiwanese Office Action issued in Taiwanese Patent Application No. 097121635 (with translation).

Oct. 19, 2011 Office Action issued in U.S. Appl. No. 12/312,000.

Apr. 25, 2012 Taiwanese Office Action issued in Taiwanese Patent Application No. 97121635 (with translation).

* cited by examiner

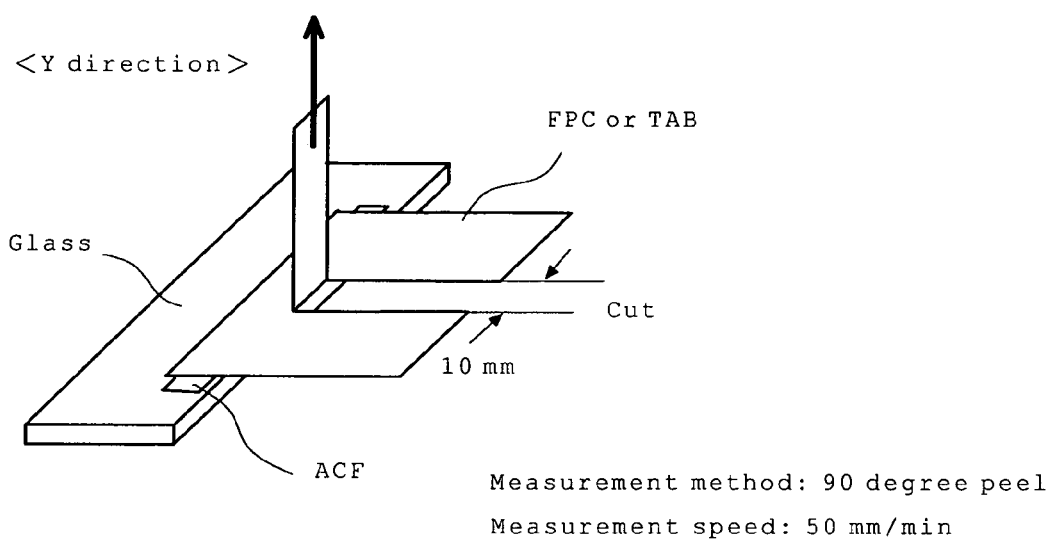

ADHESIVE COMPOSITION

This is a Division of application Ser. No. 12/312,000, filed Apr. 22, 2009, now U.S. Pat. No. 8,221,880 which is a National Phase of Application No. PCT/JP2008/060525 filed Jun. 9, 2008, which claims priority to Japanese Patent Application No. 2007-154966, filed Jun. 12, 2007. The disclosure of the prior applications is hereby incorporated by reference herein in their entirety.

TECHNICAL FIELD

The present invention relates to an adhesive composition containing a thermoplastic resin, a monofunctional urethane acrylate, and a radical polymerization initiator.

BACKGROUND ART

In most display devices such as liquid crystal display devices, plasma display devices, and organic EL display devices, a display panel is thermo-compression bonded to a flexible circuit board through an anisotropic conductive film to establish anisotropic conductive connection therebetween. Conventionally, a film formed from a dispersion of conductive particles in a binder composition containing, as main components, a thermoplastic resin, an epoxy-based resin, and an amine-based curing agent is used as such an anisotropic conductive film. The conditions for thermo-compression bonding are normally 180° C. for 7 seconds.

In recent years, the screen size of display panels is increasing. Therefore, the influence of thermal stress generated in such a display panel during thermo-compression bonding using an anisotropic conductive film is not negligible. To minimize the influence, the conditions for thermo-compression bonding need to be changed from 180° C. for 7 seconds to 160° C. ±20° C. for 4 seconds. To meet this demand, as an anisotropic conductive film capable of compression bonding at relatively low temperatures, a radical-polymerizable anisotropic conductive film formed from a dispersion of conductive particles in a binder containing, as main components, a thermoplastic resin, a polyfunctional acrylate, and a peroxide is used. However, in a thermal curing process of such a radical-polymerizable anisotropic conductive film, the formation of hydroxyl groups that improve adhesion properties to display panels and flexible circuit boards is not expected. Therefore, to improve the adhesion properties, a urethane acrylate having in its molecule at least two highly polar urethane bonds having affinity for polyimides and metal surfaces is added to the binder (Patent Document 1).

[Patent Document 1] Japanese Patent Application Laid-Open No. 2006-257208.

DISCLOSURE OF THE INVENTION

Problems to be Solved by the Invention

Generally, in display panels and flexible circuit boards, the surfaces for anisotropic conductive connection are subjected to roughing treatment with chemicals before thermo-compression bonding, in order to improve the adhesion properties to anisotropic conductive films. However, due to a continuous reduction in the pitch of the wiring patterns in recent years, if the roughing treatment of the polyimide surface of a flexible circuit board that is exposed on the metal wiring surface and between the traces is performed with chemicals in a conventional manner, adverse effects such as a reduction in the width of the wiring metal occur. It is therefore difficult to perform the roughening treatment to the same extent as that obtained conventionally.

Therefore, thermo-compression bonding through an anisotropic conductive film is necessarily performed on a surface that has not been sufficiently roughened and remains relatively smooth. In this case, unfortunately, even when the anisotropic conductive film of Patent Document 1 that contains a urethane acrylate is used, sufficient adhesion strength between the display panel and the flexible circuit board can not be obtained.

The present invention has been made to solve the above problems in the conventional technology. Accordingly, it is an object of the invention to allow an adhesive composition containing a thermoplastic resin, a polyfunctional acrylate, and a radical polymerization initiator to exhibit good adhesion strength to the polyimide surface of a flexible circuit board that is exposed on the metal wiring surfaces and between the traces, even when the polyimide surface is relatively smooth.

Means for Solving the Problems

The present inventor has found the reason why a conventionally used urethane acrylate added to an adhesive composition containing a thermoplastic resin, a polyfunctional acrylate, and a radical polymerization initiator does not develop sufficient adhesion strength between a relatively smooth display panel and a relatively smooth flexible circuit board. That is, the inventor has found that, since the urethane bonds of the urethane acrylate used in Patent Document 1 are present not at its terminal ends but inside the molecule, their action on the polyimide surface of the flexible circuit board that is exposed on the metal wiring surface and between the traces is suppressed due to the influence of steric hindrance or the like. Moreover, the inventor has found that the above object can be achieved by using a monofunctional urethane acrylate having a urethane residue at its terminal end instead of a urethane acrylate having at least two urethane bonds in its molecule. Thus, the invention has been completed.

Accordingly, the present invention provides an adhesive composition containing a thermoplastic resin, a polyfunctional acrylate, and a radical polymerization initiator, wherein the adhesive composition further contains a monofunctional urethane acrylate having a urethane residue at a terminal end, the monofunctional urethane acrylate being represented by the formula (1):

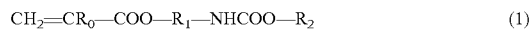

$$CH_2=CR_0-COO-R_1-NHCOO-R_2 \quad (1)$$

wherein in the formula (1), $R_0$ is a hydrogen atom or a methyl group, $R_1$ is a divalent hydrocarbon group, and $R_2$ is an optionally substituted lower alkyl group.

The present invention also provides a connection structure including: mutually facing electrodes; and the above adhesive composition containing conductive particles for anisotropic conductive connection and interposed between the electrodes, the electrodes being electrically connected through the adhesive composition.

Effects of the Invention

The adhesive composition of the present invention containing a thermoplastic resin, a polyfunctional acrylate, and a radical polymerization initiator further contains a urethane acrylate having a urethane residue at its terminal end. In this case, the acrylate residue serves as a polymerization site and is preferably present at a terminal end, and, as a necessary consequence, the urethane acrylate having a urethane residue at its terminal end is monofunctional. Therefore, the molecular structure itself of the monofunctional urethane acrylate having a urethane residue at its terminal end can be smaller than that of a urethane acrylate having at least two urethane bonds in its molecule. Moreover, with the monofunctional urethane acrylate, the affinity of the urethane bond for the polyimide surface of a flexible circuit board that is exposed on the metal wiring surface and between the traces can be fully developed. Therefore, good adhesion strength can be obtained even when the polyimide surface is relatively smooth.

BRIEF DESCRIPTION OF THE DRAWING

FIG. 1 is a diagram describing an adhesion strength test (in the FIGURE, FPC is the abbreviation of "flexible printed circuit," TAB is the abbreviation of "tape automated bonding," and ACF is the abbreviation of "anisotropic conductive film").

BEST MODE FOR CARRYING OUT THE INVENTION

An adhesive composition of the present invention contains a thermoplastic resin, a polyfunctional acrylate, and a radical polymerization initiator, wherein the adhesive composition further contains a monofunctional urethane acrylate having a urethane residue at its terminal end. The monofunctional urethane acrylate is represented by the formula (1):

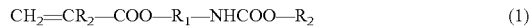

$$CH_2=CR_0-COO-R_1-NHCOO-R_2 \qquad (1)$$

In the formula (1), $R_0$ is a hydrogen atom or a methyl group. When $R_0$ is a hydrogen atom, the monofunctional urethane acrylate of the formula (1) has at its terminal end an acrylate residue, which is more reactive relative to a methacrylate residue. When $R_0$ is a methyl group, the monofunctional urethane acrylate of the formula (1) has at its terminal end a methacrylate residue. Therefore, if the adhesive composition is required to have high reactivity, $R_0$ is preferably a hydrogen atom. If the adhesive composition is required to have low reactivity, $R_0$ is preferably a methyl group.

$R_1$ is a divalent hydrocarbon group. Examples of the divalent hydrocarbon group include: alkylene groups such as a methylene group, an ethylene group, a propylene group, a butylene group, a cyclohexylene group, and the like; arylene groups such as a phenylene group, a naphthalene group, and the like; and aralkylene groups such as a xylylene group and the like. Of these, alkylene groups are preferred in terms of improving adhesion strength; methylene and ethylene groups are more preferred; and an ethylene group is particularly preferred.

$R_2$ is an optionally substituted lower alkyl group. Examples of the substituent include: alkoxy groups such as a methoxy group, an ethoxy group, and the like; and aryl groups such as a phenyl group and the like. Examples of the lower alkyl group include a methyl group, an ethyl group, an isopropyl group, a propyl group, a butyl group, an isobutyl group, a pentyl group, a hexyl group, a cyclohexyl group, and the like. Preferred specific examples of $R_2$ include a methyl group, an ethyl group, an ethoxyethyl group, a butyl group, and a hexyl group. Of these, methyl and ethyl groups are more preferred in terms of improving adhesion strength.

Therefore, preferred specific examples of the monofunctional urethane acrylate of the formula (1) include N-(methacryloyloxyethyl)methylcarbamate, N-(methacryloyloxyethyl)ethylcarbamate, N-(methacryloyloxyethyl) ethoxyethylcarbamate, N-(methacryloyloxyethyl) butylcarbamate, N-(methacryloyloxyethyl)hexylcarbamate, and the like. Of these, N-(methacryloyloxyethyl)methylcarbamate and N-(methacryloyloxyethyl)ethylcarbamate are particularly preferred.

An excessively low amount of the monofunctional urethane acrylate in the adhesive composition results in a reduction in the adhesion strength, and an excessively large amount results in a reduction in the cohesive force, so that conduction failure tends to occur. Therefore, the amount of the monofunctional urethane acrylate is preferably in the range of from 2 to 20 percent by mass and more preferably in the range of from 5 to 10 percent by mass with respect to the mass of the resin solids (the total mass of the thermoplastic resin, the polyfunctional acrylate, the radical polymerization initiator, and the monofunctional urethane acrylate).

A commercial product may be used as the monofunctional urethane acrylate. Moreover, the monofunctional urethane acrylate may be synthesized by reacting a compound having a methacryloyloxy group and a terminal isocyanate group with an alcohol, as disclosed in Japanese Patent Application Laid-Open No. Sho 54-005921.

The thermoplastic resin constituting the adhesive composition of the present invention is a component for forming a film and can be appropriately selected from thermoplastic resins conventionally used in the fields of anisotropic conductive adhesives, insulating adhesives, and the like. Specific examples of the thermoplastic resin include phenoxy resins, polyurethane resin esters, polyimides, polyamides, poly (meth)acrylates, polyether polyurethanes, NBR resins, and the like. The weight average molecular weights of these thermoplastic resins are generally 5,000 to 150,000, in order to ensure film-forming properties and to obtain compatibility with other components.

When the amount of the thermoplastic resin in the adhesive composition is too low, a film is difficult to form. When the amount is too large, the resin cannot be excluded at the time of connection, so that conduction failure tends to occur. Therefore, the amount of the thermoplastic resin is preferably in the range of from 10 to 60 percent by mass, and more preferably in the range of from 20 to 50 percent by mass with respect to the mass of the resin solids (the total mass of the thermoplastic resin, the polyfunctional acrylate, the radical polymerization initiator, and the monofunctional urethane acrylate).

The polyfunctional acrylate constituting the adhesive composition of the present invention is a component for introducing a three-dimensional network structure in a film of the adhesive composition in order to enhance the cohesive force. The polyfunctional acrylate can be appropriately selected from polymerizable compounds having at least two acrylate or methacrylate residues in their molecule, which are polyfunctional acrylates conventionally used in the fields of anisotropic conductive adhesives, insulating adhesives, and the like. Specific examples of the polyfunctional acrylate include trimethylolpropane tri(meth)acrylate, polyethylene glycol di(meth)acrylate, polyalkylene glycol di(meth)acrylates, dicyclopentenyl (meth)acrylate, dicyclopentenyloxyethyl (meth)acrylate, neopentyl glycol di(meth)acrylate, dipentaerythritol hexa(meth)acrylate, isocyanuric acid-modified bifunctional (meth)acrylates, isocyanuric acid-modified trifunctional (meth)acrylates, and the like.

When the amount of the polyfunctional acrylate in the adhesive composition is too low, the cohesive force is insufficient to cause a reduction in connection reliability. When the amount is too large, the adhesive composition becomes hard, and the stress relaxation effect is reduced, so that the adhesive force tends to decrease. Therefore, the amount of the polyfunctional acrylate is preferably in the range of from 10 to 60 percent by mass, and more preferably in the range of from 20 to 50 percent by mass with respect to the mass of the resin solids (the total mass of the thermoplastic resin, the polyfunctional acrylate, the radical polymerization initiator, and the monofunctional urethane acrylate).

The radical polymerization initiator constituting the adhesive composition of the present invention is an initiator for radical polymerization of the polyfunctional acrylate and the monofunctional urethane acrylate. The radical polymerization initiator can be appropriately selected from radical polymerization initiators which are less likely to generate gas during polymerization and are conventionally used in the fields of anisotropic conductive adhesives, insulating adhesives, and the like. Specific examples of the radical polymerization initiator include organic peroxides having a one-minute half-life temperature of 90 to 175° C. and a molecular weight of 180 to 1,000. These are preferably used because of their stability, reactivity, and compatibility. Specific examples of such organic peroxides include benzoyl peroxide, cumylperoxy neodecanoate, 1,1,3,3-tetramethylbutylperoxy neodecanoate, 1-cyclohexyl-1-methylethylperoxy neodecanoate, t-hexylperoxy neodecanoate, t-butylperoxy neodecanoate, t-butylperoxy pivalate, 1,1,3,3-tetramethylbutylperoxy-2-ethylhexanoate, 2,5-dimethyl-2,5-di(2-ethylhexanoylperoxy)hexane, t-hexylperoxy-2-ethylhexanoate, t-butylperoxy-2-ethylhexanonate, t-butylperoxy neoheptanoate, t-amylperoxy-2-ethylhexanoate, di-t-butylperoxy hexahydroterephthalate, t-amylperoxy-3,5,5-trimethylhexanoate, 3-hydroxy-1,1-dimethylbutylperoxy neodecanoate, t-amylperoxy neodecanoate, t-amylperoxy-2-ethylhexanoate, t-hexylperoxy isopropyl monocarbonate, t-butylperoxy maleic acid, t-butylperoxy-3,5,5-trimethylhexanoate, t-butylperoxy laurate, 2,5-dimethyl-2,5-di(3-methylbenzoylperoxy)hexane, t-butylperoxy-2-ethylhexyl monocarbonate, t-hexylperoxy benzoate, 2,5-dimethyl-2,5-di(benzoylperoxy)hexane, t-butylperoxy benzoate, dibutylperoxy trimethyladipate, t-amylperoxy normal-octoate, t-amylperoxy isononanoate, t-amylperoxy benzoate, and the like. These compounds may be used as a mixture of two or more.

When the amount of the radical polymerization initiator in the adhesive composition is too low, the curing is insufficient. When the amount is too large, the exclusion properties of the resins at the time of heating and pressurizing decrease, so that the connection resistance tends to increase. Therefore, the amount of radical polymerization initiator is preferably in the range of from 1 to 10 percent by mass, and more preferably in the range of from 2 to 8 percent by mass with respect to the mass of the resin solids (the total mass of the thermoplastic resin, the polyfunctional acrylate, the radical polymerization initiator, and the monofunctional urethane acrylate).

The adhesive composition of the present invention may contain, if necessary, conductive particles, such as nickel particles, having a particle size of 0.1 to 10 μm, anisotropic conductive particles, such as resin-coated nickel particles, having a particle size of 2 to 10 μm, or an insulating filler, such as silica, having a particle size of 0.01 to 1 μm. When the conductive particles are added, the adhesive composition can be used as a conductive adhesive composition. When the anisotropic conductive particles are added, the adhesive composition can be used as an anisotropic conductive adhesive. In this case, the amount of the anisotropic conductive particles added is preferably in the range of from 1 to 50 percent by mass, and more preferably in the range of from 1 to 40 percent by mass with respect to the mass of the resin solids (the total mass of the thermoplastic resin, the polyfunctional acrylate, the radical polymerization initiator, and the monofunctional urethane acrylate). When the filler is added, the mechanical strength of the cured product can be improved. Moreover, any suitable rubber material may be added in order to relax the stress generated during curing. If necessary, a general purpose solvent, including an alcohol such as methanol, ethanol, butanol, or the like, an ester such as ethyl acetate or the like, or a ketone such as acetone, methyl ethyl ketone, or the like, may be appropriately added. When the adhesive composition is formed into a film, it is preferable to add any of these solvents.

The adhesive composition of the present invention can be prepared by uniformly mixing the thermoplastic resin, the polyfunctional acrylate, the radical polymerization initiator, the monofunctional urethane acrylate having a urethane residue at its terminal end and represented by the formula (1), and if necessary other additive components and a solvent by routine methods.

The adhesive composition of the present invention can be used as a paste or a film according to a known method. For example, by sandwiching the adhesive composition of the present invention formed into a paste or film between mutually-facing electrodes and subjecting them to thermo-compression bonding, a connection structure having the electrodes electrically connected to each other is obtained. Examples of the mutually-facing electrodes include, but not limited to, a combination of an electrode of a display panel and an electrode of a flexible circuit board. In a preferred embodiment, one of the mutually-facing electrodes is an electrode pad of a semiconductor device.

As the conditions for thermo-compression bonding, relatively low-temperature short-time curing conditions may be used, i.e., normally 100 to 200° C. for 3 to 10 seconds and preferably 130 to 200° C. for 3 to 6 seconds. As above, a wide compression bonding temperature margin can be realized.

EXAMPLES

Hereinafter, the present invention is specifically described by way of Examples.

Example 1

100 parts by mass of methanol was added to 10 parts by mass of isocyanoethyl methacrylate, and the mixture was stirred at 60° C. for 10 hours, whereby a methanol solution of N-(methacryloyloxyethyl)methylcarbamate was obtained. The methanol solution containing 10 parts by mass of N-(methacryloyloxyethyl)methylcarbamate was uniformly mixed with 40 parts by mass of phenoxy resin (YP50, TOHTO KASEI CO., LTD.), 40 parts by mass of diacrylate (LIGHT-ESTER 3EG, KYOEISHA CHEMICAL Co., LTD.), 10 parts by mass of polyester-based polyurethane (NIPPORAN 3113, NIPPON POLYURETHANE INDUSTRY CO., LTD.), 3 parts by mass of benzoyl peroxide (NOF CORPORATION), and a mixed solvent of ethyl acetate and toluene (1:1 (volume ratio)) in such an amount that the resin solids content is 50 percent by mass, whereby an adhesive composition was obtained.

Example 2

The same procedure as in Example 1 was repeated except that 100 parts by mass of ethanol was used instead of 100 parts by mass of methanol, whereby an ethanol solution of N-(methacryloyloxyethyl)ethylcarbamate was prepared and an adhesive composition was obtained.

Example 3

The same procedure as in Example 1 was repeated except that 100 parts by mass of ethoxyethanol was used instead of 100 parts by mass of methanol, whereby an ethoxyethanol solution of N-(methacryloyloxyethyl)ethoxyethylcarbamate was prepared and an adhesive composition was obtained.

Example 4

The same procedure as in Example 1 was repeated except that 100 parts by mass of butanol was used instead of 100 parts by mass of methanol, whereby a butanol solution of N-(methacryloyloxyethyl)butylcarbamate was prepared and an adhesive composition was obtained.

Example 5

The same procedure as in Example 1 was repeated except that 100 parts by mass of hexanol was used instead of 100 parts by mass of methanol, whereby a hexanol solution of N-(methacryloyloxyethyl)hexylcarbamate was prepared and an adhesive composition was obtained.

Comparative Example 1

The same procedure as in Example 1 was repeated except that 100 parts by mass of phenol was used instead of 100 parts by mass of methanol, whereby a phenol solution of N-(methacryloyloxyethyl)phenylcarbamate was prepared and an adhesive composition was obtained.

Comparative Example 2

10 parts by mass of bifunctional urethane acrylate (U-ZPPA, SHIN-NAKAMURA CHEMICAL CORPORATION) was uniformly mixed with 40 parts by mass of phenoxy resin (YP50, TOHTO KASEI CO., LTD.), 40 parts by mass of diacrylate (LIGHT-ESTER 3EG, KYOEISHA CHEMICAL Co., LTD.), 10 parts by mass of polyester-based polyurethane (NIPPORAN 3113, NIPPON POLYURETHANE INDUSTRY CO., LTD.), 3 parts by mass of benzoyl peroxide (NOF CORPORATION), and a mixed solvent of ethyl acetate and toluene (1:1 (volume ratio)) in such an amount that the resin solids content is 50 percent by mass, whereby an adhesive composition was obtained.

Comparative Example 3

40 parts by mass of phenoxy resin (YP50, TOHTO KASEI CO., LTD.), 40 parts by mass of diacrylate (LIGHT-ESTER 3EG, KYOEISHA CHEMICAL Co., LTD.), 10 parts by mass of polyester-based polyurethane (NIPPORAN 3113, NIPPON POLYURETHANE INDUSTRY CO., LTD.), 3 parts by mass of benzoyl peroxide (NOF CORPORATION), and a mixed solvent of ethyl acetate and toluene (1:1 (volume ratio)) in such an amount that the resin solids content is 50 percent by mass were uniformly mixed, whereby an adhesive composition was obtained.

Evaluation

The adhesive compositions of Examples and Comparative Examples were applied to 50 μm thick polyethylene terephthalate films subjected to releasing treatment to a dry thickness of 50 μm and were dried in an oven at 80° C. for 5 minutes, whereby adhesive films were produced. The adhesion strengths of the obtained adhesive films were measured as described below.

(Adhesion Strength Test: See FIG. 1)

An ITO-glass substrate produced by forming an ITO film on a glass substrate having a thickness of 0.7 mm and a polyimide flexible circuit board (tape width: 40 mm) with a pitch of 50 μm (the width of copper traces: 25 μm, the thickness of copper traces: 8 μm) were prepared. The electrodes of the wiring patterns were disposed to face each other with one of the adhesive films held therebetween, and thermo-compression bonding was performed under the conditions of 160° C. and 4 Mpa for 4 seconds. After thermo-compression bonding, two cuts spaced 10 mm apart and extending to the adhesive film were made in the polyimide flexible circuit board, and a 90 degree peel test was performed using a tensile testing apparatus (Tensilon, ORIENTEC CO., LTD) at a speed of 50 mm/min. The obtained adhesion strength values are shown in Table 1. For practical purposes, the adhesion strength is desirably 5 N/cm or more.

TABLE 1

| Substituent in monofunctional urethane acrylate | Example | | | | | Comparative Example | | |
|---|---|---|---|---|---|---|---|---|
| (formula (1)) | 1 | 2 | 3 | 4 | 5 | 1 | 2 | 3 |
| $R_0$ | Methyl | Methyl | Methyl | Methyl | Methyl | Methyl | Bifunctional urethane acrylate used | Urethane acrylate not used |
| $R_1$ | Ethylene | Ethylene | Ethylene | Ethylene | Ethylene | Ethylene | | |
| $R_2$ | Methyl | Ethyl | Ethoxy ethyl | Butyl | Hexyl | Phenyl | | |
| Adhesion strength [N/cm] | 10 | 9 | 8 | 6 | 5 | 4 | 3 | 2 |

As can be seen from Table 1, in each of the adhesive compositions of Examples 1 to 5, the adhesion strength was practically preferable, i.e., 5 N/cm or more. In particular, when $R_2$ is methyl or ethyl, the adhesion strength was particularly high.

However, in each of Comparative Example 1 in which $R_2$ was phenyl, Comparative Example 2 in which a bifunctional urethane acrylate was used, and Comparative Example 3 in which a urethane acrylate was not used, the adhesion strength was not 5 N/cm or more.

INDUSTRIAL APPLICABILITY

The adhesive composition of the present invention containing a thermoplastic resin, a polyfunctional acrylate, and a radical polymerization initiator further contains a monofunctional urethane acrylate having a urethane residue at its terminal end. Therefore, the affinity of the urethane bond for the polyimide surface of a flexible circuit board that is exposed on the metal wiring surface and between the traces can be fully developed. Accordingly, good adhesion strength can be obtained even when the polyimide surface is relatively smooth. The adhesive composition is useful for connection of fine-pitched electronic materials having relatively smooth adherent surfaces.

The invention claimed is:

1. An anisotropic conductive connection structure comprising: mutually facing electrodes; and an adhesive composition interposed between the electrodes, the electrodes being electrically connected through the adhesive composition, wherein the adhesive composition comprises a thermoplastic resin, a polyfunctional acrylate, a conductive particle for anisotropic conductive connection, and a radical polymerization initiator, wherein the adhesive composition further comprises a monofunctional urethane acrylate having a urethane residue at a terminal end, the monofunctional urethane acrylate being represented by the formula (1):

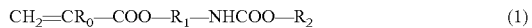
$$CH_2=CR_0-COO-R_1-NHCOO-R_2 \quad (1)$$

wherein $R_0$ is a hydrogen atom or a methyl group, $R_1$ is a divalent hydrocarbon group, and $R_2$ is an optionally substituted methyl, ethyl, isopropyl, propyl, butyl, isobutyl, pentyl, hexyl or cyclohexyl group.

2. The connection structure according to claim 1, wherein one of the mutually-facing electrodes is an electrode pad of a semiconductor device.

3. The connection structure according to claim 1, wherein the monofunctional urethane acrylate of the adhesive composition is contained in an amount of 2 to 20 percent by mass with respect to the total mass of the thermoplastic resin, the polyfunctional acrylate, the radical polymerization initiator, and the monofunctional urethane acrylate.

4. A connection structure according to claim 1, wherein $R_1$ of formula (1) is an alkylene group.

5. A connection structure according to claim 4, wherein the alkylene group is an ethylene group.

6. A connection structure according to claim 1, wherein $R_2$ of formula (1) is a methyl group, an ethyl group, an ethoxyethyl group, a butyl group, or a hexyl group.

7. A connection structure according to claim 6, wherein $R_2$ is a methyl group or an ethyl group.

* * * * *